(12) United States Patent
Avanzino et al.

(10) Patent No.: US 7,790,497 B2
(45) Date of Patent: Sep. 7, 2010

(54) METHOD TO PREVENT ALLOY FORMATION WHEN FORMING LAYERED METAL OXIDES BY METAL OXIDATION

(75) Inventors: Steven Avanzino, Cupertino, CA (US); Jeffrey A. Shields, Sunnyvale, CA (US); Joffre Bernard, Santa Clara, CA (US); Suzette K. Pangrle, Cupertino, CA (US)

(73) Assignee: Spansion LLC, Sunnyvale, CA (US)

( * ) Notice: Subject to any disclaimer, the term of this patent is extended or adjusted under 35 U.S.C. 154(b) by 115 days.

(21) Appl. No.: 12/004,124

(22) Filed: Dec. 20, 2007

(65) Prior Publication Data

US 2009/0163018 A1    Jun. 25, 2009

(51) Int. Cl.
*H01L 21/00*    (2006.01)

(52) U.S. Cl. .................. 438/95; 438/687; 257/E21.495
(58) Field of Classification Search .................... 438/95, 438/600, 687
See application file for complete search history.

(56) References Cited

U.S. PATENT DOCUMENTS

| 6,455,426 B1 * | 9/2002 | Jain ............................ 438/687 |
| 2003/0059959 A1 * | 3/2003 | Hong ............................ 438/3 |
| 2007/0215977 A1 * | 9/2007 | Lee et al. ..................... 257/536 |

* cited by examiner

*Primary Examiner*—W. David Coleman

(57) ABSTRACT

The present method of fabricating a resistive memory device includes the steps of providing a first electrode, oxidizing a portion of the first electrode with an oxidizing agent, providing a metal body on the oxidized portion of the first electrode, oxidizing the entire metal body with an oxidizing agent, and providing a second electrode on the oxidized metal body.

10 Claims, 7 Drawing Sheets

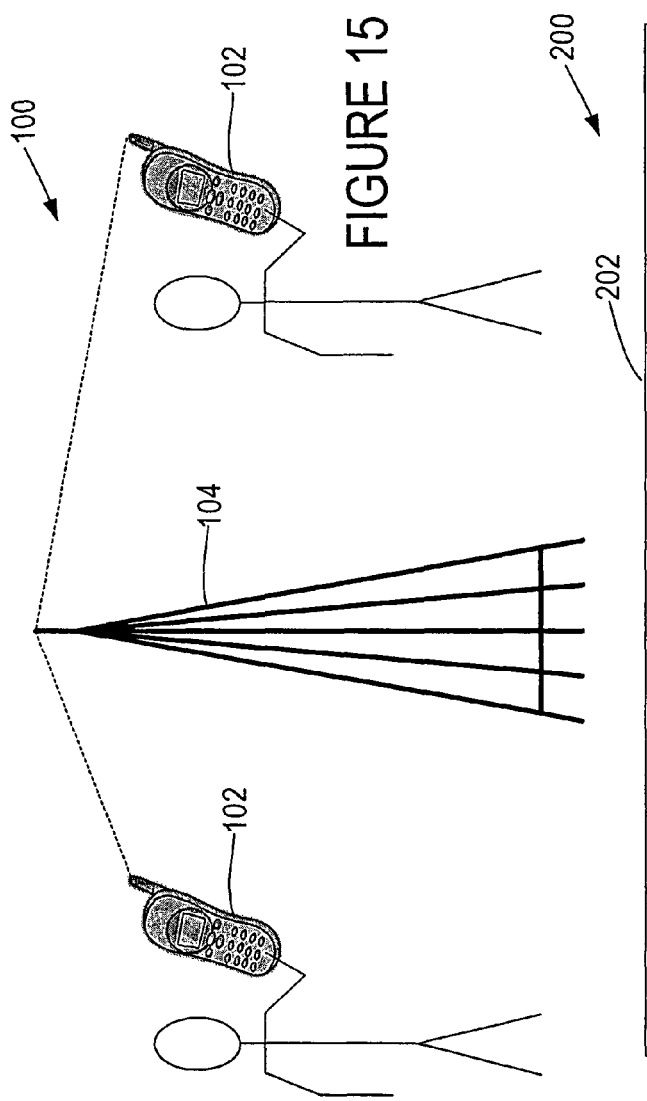
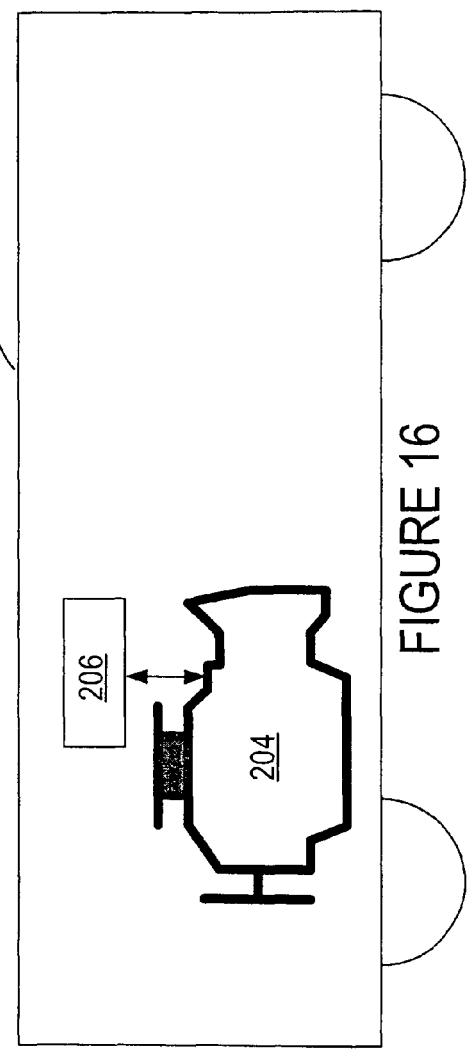

METHOD TO PREVENT ALLOY FORMATION WHEN FORMING LAYERED METAL OXIDES BY METAL OXIDATION

BACKGROUND OF THE INVENTION

1. Technical Field

This invention relates generally to resistive memory devices, and more particularly, to a method of fabricating oxide layers of such a device.

2. Background Art

FIG. 1 illustrates a type of two-terminal memory device 30. The memory device 30 includes a metal electrode 32, an active, for example metal oxide layer 34 on the electrode 32, and a metal electrode 36 on the layer 34. Initially, and with reference to FIG. 2, assuming that the memory device 30 is unprogrammed, in order to program the memory device 30, ground is applied to the electrode 32, while a positive voltage is applied to electrode 36, so that an electrical potential $V_{pg}$ (the "programming" electrical potential) is applied across the memory device 30 from a higher to a lower electrical potential in the direction from electrode 36 to electrode 32. Upon removal of such potential the memory device 30 remains in a conductive or low-resistance state having an on-state resistance.

In the read step of the memory device 30 in its programmed (conductive) state, an electrical potential $V_r$ (the "read" electrical potential) is applied across the memory device 30 from a higher to a lower electrical potential in the direction from electrode 36 to electrode 32. This electrical potential is less than the electrical potential $V_{pg}$ applied across the memory device 30 for programming (see above). In this situation, the memory device 30 will readily conduct current, which indicates that the memory device 30 is in its programmed state.

In order to erase the memory device, a positive voltage is applied to the electrode 32, while the electrode 36 is held at ground, so that an electrical potential $V_{er}$ (the "erase" electrical potential) is applied across the memory device 30 from a higher to a lower electrical potential in the direction of from electrode 32 to electrode 36.

In the read step of the memory device 30 in its erased (substantially non-conductive) state, the electrical potential $V_r$ is again applied across the memory device 30 from a higher to a lower electrical potential in the direction from electrode 36 to electrode 32 as described above. With the layer 34 (and memory device 30) in a high-resistance or substantially non-conductive state, the memory device 30 will not conduct significant current, which indicates that the memory device 30 is in its erased state.

It may be desirable to vary the configuration of a memory device of this type in order to vary the operating characteristics thereof. For example, the device 40 as shown in FIG. 3 includes a second metal oxide layer 46 of thickness A on the oxide layer 44 of thickness B (metal of oxide layer 46 selected as different from metal of oxide layer 44), along with electrode 42 and electrode 48. Inclusion of this second metal oxide layer 46, and selection of the thicknesses of the oxide layers 44, 46, can provide variation of the operating characteristics of such a device 40, for example varying the programming and erase characteristics of the device 40 as desired. However, fabrication of such a device 40 has been problematical, as will now be shown and described.

Initially, it is assumed that a device with a layer thickness A and a layer thickness B is to be achieved (FIG. 3), as selected by the fabricator of the device. With reference to FIG. 4, a metal electrode 50 is provided. A metal layer 52 (different from the metal of electrode 50) is deposited on the electrode 50. This metal is of a selected thickness C so that upon complete oxidation of the entire layer 52, at elevated temperature and in the presence of an oxidizing agent such as $O_2$, it would be expected that a resulting oxide layer of thickness A would result, as one skilled in the art would realize. That is to say, one can predict and expect the thickness A when the metal layer of thickness C is fully converted to oxide. However, it has been found that because of the high temperature involved in the oxidation process, metal of the layer 52 will alloy with the metal of electrode 50 during this oxidation process, forming the alloy layer 54. FIG. 5 illustrates partial oxidation 60 of the metal layer 52 and formation of the alloy layer 54 between the metal layer 52 and electrode 50. This alloying reduces the amount of metal in the layer 52 which can be oxidized. Further oxidation increases the thickness of the alloy layer 54, reducing even further the amount of metal that can be oxidized, so that upon full oxidation of the remaining metal layer 52 (down to the alloy layer 54, FIG. 6), the thickness D of the oxide layer 60 is much less than the target, desired thickness A.

Further oxidation causes the alloy layer 54 to oxidize, forming an alloy oxide layer 64 (FIG. 7), the presence of which is not desired. The oxidation process may be continued to oxidize a portion 66 of the electrode 50 to the desired thickness B (FIG. 8). Electrode 68 is then provided on the oxide layer 60, resulting in the device 70 (FIG. 9).

It will be seen that the resulting structure includes an incorrect thickness of the oxide layer 60, along with an undesired alloy oxide layer 64.

What is needed is a process which provides that the desired configuration of device is achieved.

DISCLOSURE OF THE INVENTION

The present method of fabricating a resistive memory device comprises providing a first electrode, reacting a portion of the first electrode with an agent, providing a metal body on the reacted portion of the first electrode, reacting the entire metal body with an agent, and providing a second electrode on the reacted metal body.

The present invention is better understood upon consideration of the detailed description below, in conjunction with the accompanying drawings. As will become readily apparent to those skilled in the art from the following description, there is shown and described an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

FIGS. 15-17 illustrate systems for using devices produced in accordance with the present method.

BEST MODE(S) FOR CARRYING OUT THE INVENTION

Reference is now made in detail to a specific embodiment of the present invention which illustrates the best mode presently contemplated by the inventors for practicing the invention.

Figure 1:
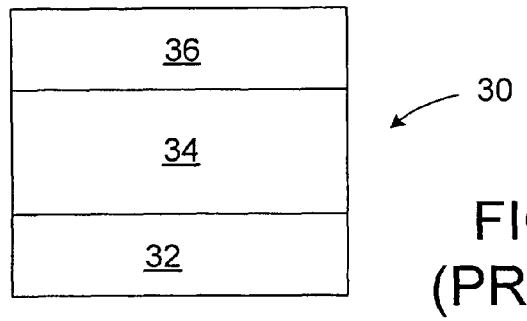
FIGS. 1 and 2 illustrate a memory device and the operating characteristics thereof.
Figure 2:
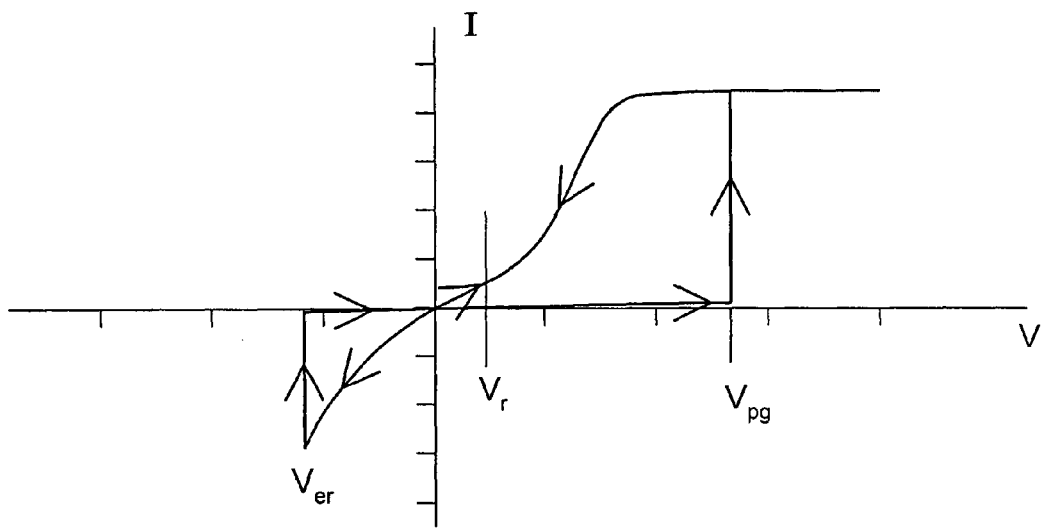
Figure 3:
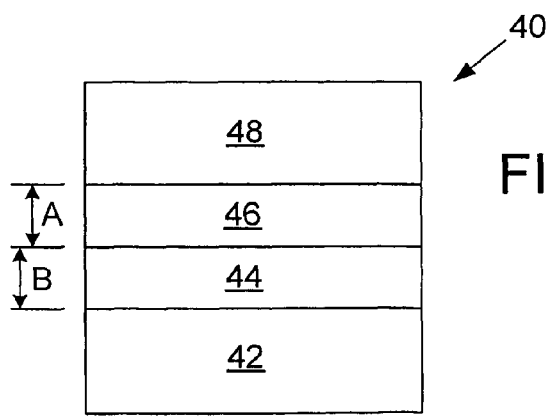
FIG. 3 illustrates the configuration of a desired resistive memory device.
Figure 4:
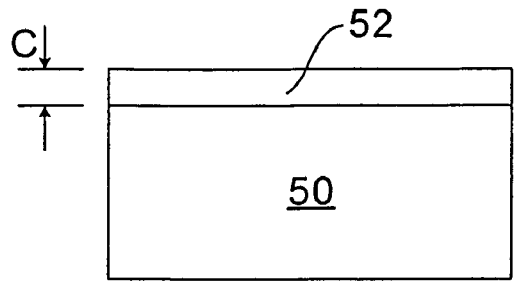
FIGS. 4-9 illustrate a prior art approach in attempting to fabricate the device of FIG. 3.
Figure 5:
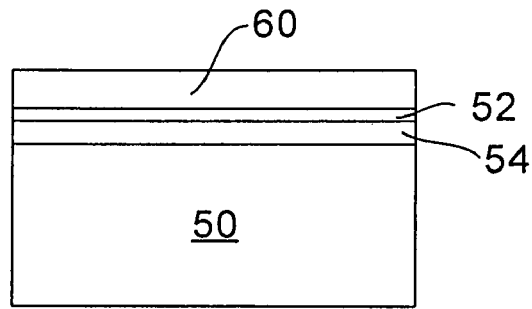
Figure 6:
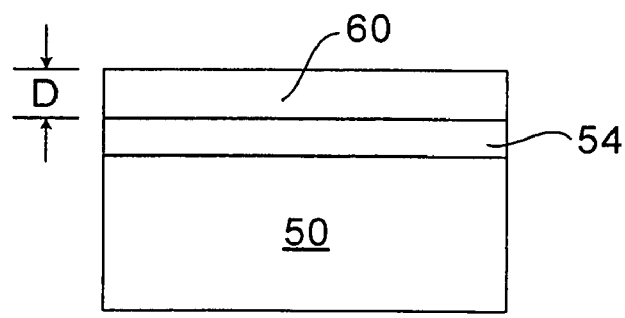
Figure 7:
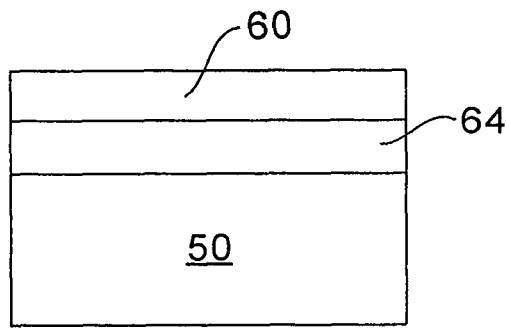
Figure 8:
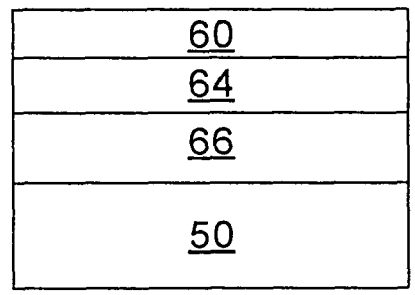
Figure 9:
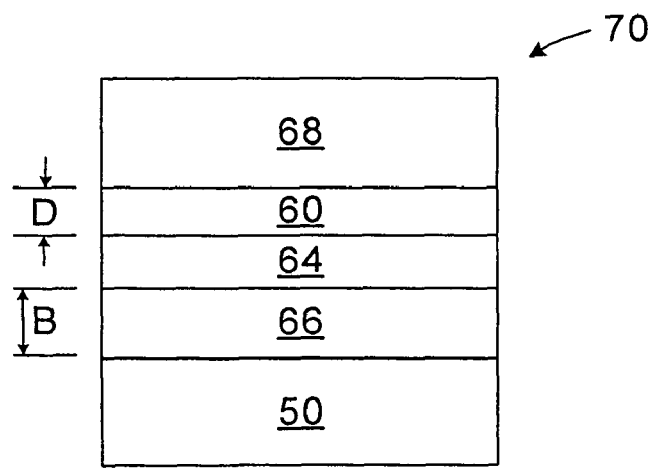
Figure 10:
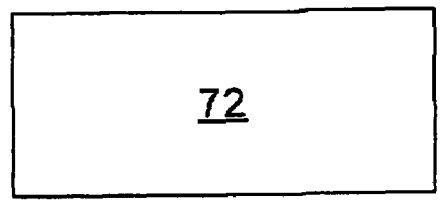
FIGS. 10-14 illustrate the present method for fabricating the device of FIG. 3.
Figure 11:
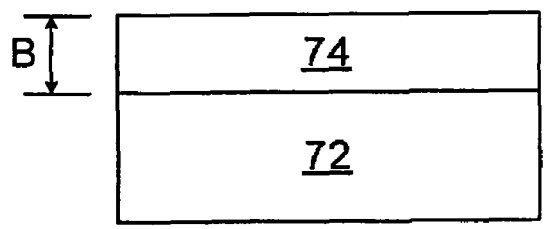
Figure 12:
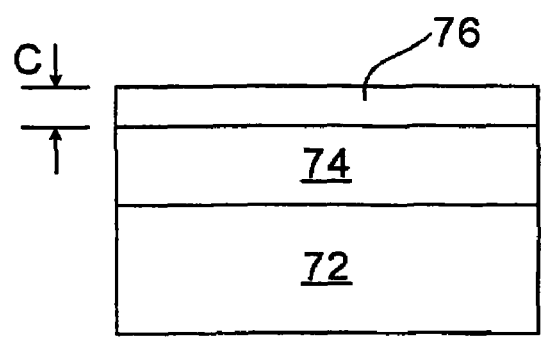
Figure 13:
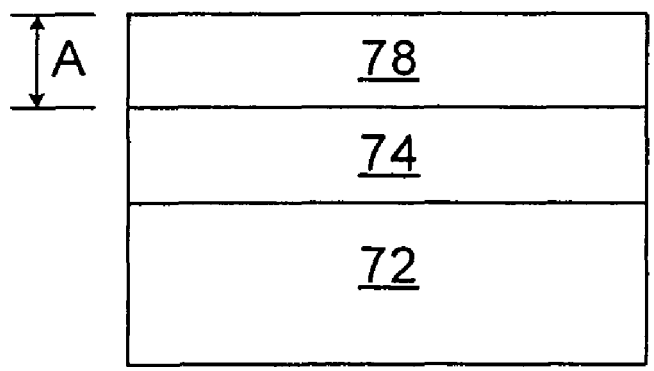

In the present method, initially, a metal, for example Ni, electrode 72 is provided (FIG. 10). The upper surface of the Ni electrode 72 is exposed to an oxidizing agent, i.e., $O_2$, at an elevated temperature of, for example, 250° C. and a pressure of ~1 Torr for 3 minutes. This causes a reaction of $O_2$ with Ni of the electrode 72, i.e., oxidation of a portion of the Ni electrode to form an oxide, i.e., a NiO portion 74 (FIG. 11). The thickness of this reacted, oxide portion 74 is determined by the process parameters recited above, which may be varied as chosen. In this case, the process parameters are chosen to provide an oxide portion 74 of desired thickness B as shown in FIG. 3. Next, the surface of the oxide portion 74 is cleaned by a brief Ar+ treatment to remove adventitious impurities. A thin Cu layer 76 is then sputter deposited onto the NiO portion 74 (FIG. 12). The Cu layer 76 is exposed to an oxidizing agent, i.e., $O_2$, at an elevated temperature of, for example, 200-250° C. and a pressure of ~1 Torr for 1 minute. This causes a reaction of $O_2$ with Cu layer 76, i.e., to fully convert the Cu layer 76 to copper oxide 78, i.e., $Cu_2O$ or CuO (FIG. 13). The thickness C of the Cu layer 76 is chosen so that upon oxidation of the entire layer 76, the resulting oxide layer 78 is of desired thickness A as shown in FIG. 3.

During the oxidation of the Cu layer 76, Cu metal is blocked from the Ni of the electrode by the Ni oxide portion 74, so that an alloy of Cu and Ni is not formed, i.e., Cu material is not lost as in the prior art approach described above. Thus the entire initial thickness C of the Cu layer 76 as originally formed is converted to oxide 78, and the resulting desired thickness A of the copper oxide layer 78 (based on full conversion of the Cu layer 76 to oxide) is achieved.

Figure 14:
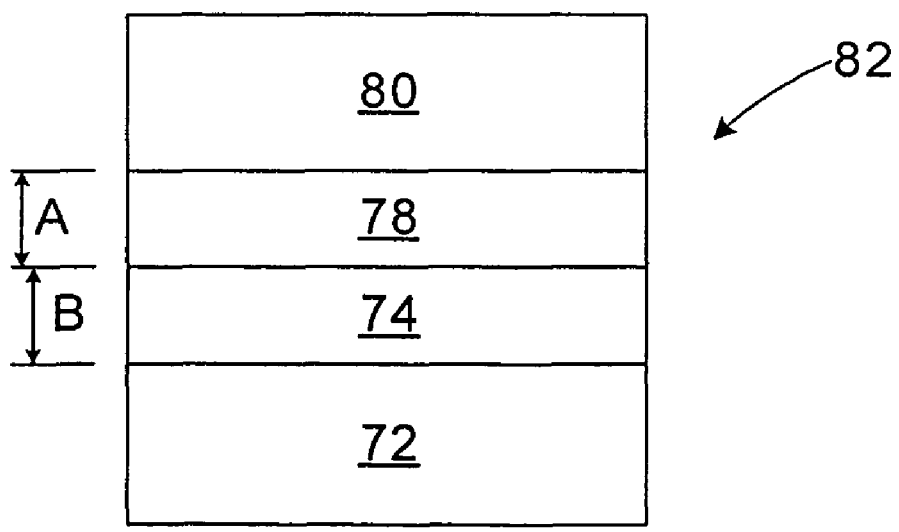

Finally, a metal electrode 80 is provided on the oxide layer to complete the resistive memory device 82 (FIG. 14).

As will be seen, the resulting structure, including dimensions A and B, is as shown in FIG. 3, as desired. The present process avoids alloying of metals of the device, in turn allowing one to accurately produce a desired resistive memory device.

FIG. 15 illustrates a system 100 utilizing memory devices as described above. As shown therein, the system 100 includes hand-held devices 102 in the form of cell phones, which communicate through an intermediate apparatus such as a tower 104 (shown) and/or a satellite. Signals are provided from one cell phone to the other through the tower 104. Such a cell phone with advantage uses memory devices of the type described above for data storage, for example names, telephone number and other data. One skilled in the art will readily understand the advantage of using such memory devices in other hand-held devices 102 which utilize data storage, such as portable media players, personal digital assistants, digital cameras and the like.

FIG. 16 illustrates another system 200 utilizing memory devices as described above. The system 200 includes a vehicle 202 having an engine 204 controlled by an electronic control unit 206. The electronic control unit 306 with advantage uses memory devices of the type described above for data storage, for example data relating to engine and vehicle operating conditions.

Figure 17:
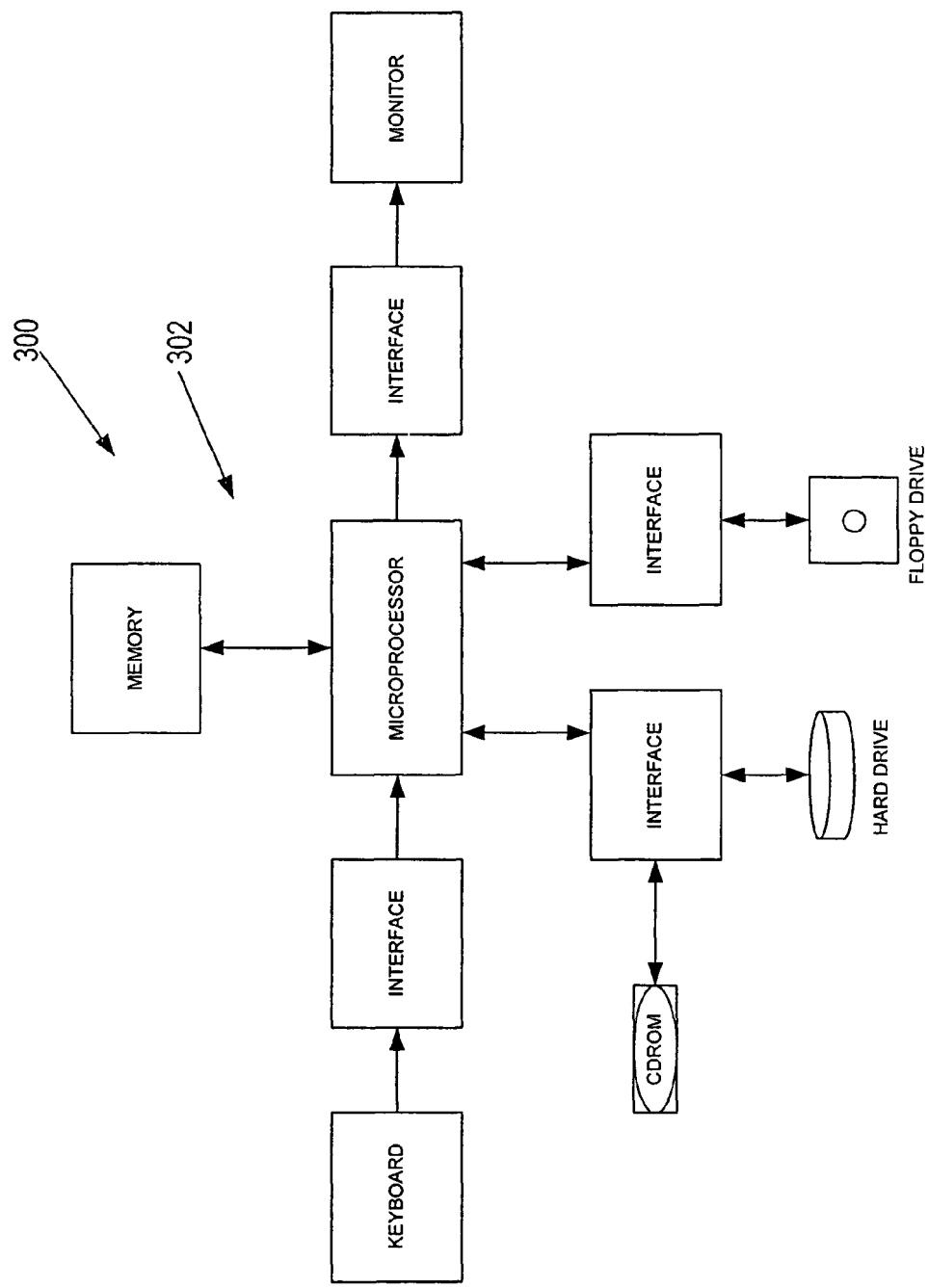

FIG. 17 illustrates yet another system 300 utilizing memory devices as described above. This system 300 is a computer 302 which includes an input in the form of a keyboard, and a microprocessor for receiving signals from the keyboard through an interface. The microprocessor also communicates with a CDROM drive, a hard drive, and a floppy drive through interfaces. Output from the microprocessor is provided to a monitor through an interface. Also connected to and communicating with the microprocessor is memory which may take the form of ROM, RAM, flash and/or other forms of memory. The memory with advantage uses memory devices of the type described above for storage of any data which is of use.

The foregoing description of the embodiment of the invention has been presented for purposes of illustration and description. It is not intended to be exhaustive or to limit the invention to the precise form disclosed. Other modifications or variations are possible in light of the above teachings.

The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of fabricating an electronic device comprising:
    providing a first body;
    reacting a portion of the first body with an agent;
    providing a second body on the reacted portion of the first body; and
    reacting the entire second body with an agent wherein the first body is Ni and the second body is Cu.

2. A method of fabricating an electronic device comprising:
    providing a first body;
    oxidizing a portion of the first body;
    providing a second body on the oxidized portion of the first body; and
    oxidizing the entire second body wherein the first body is Ni and the second body is Cu.

3. The method of claim 2 wherein the first body is a metal body.

4. The method of claim 2 wherein the second body is a metal body.

5. A method of fabricating a resistive memory device comprising:
    providing a first electrode;
    reacting a portion of the first electrode with an agent;
    providing a metal body on the reacted portion of the first electrode;
    reacting the entire metal body with an agent; and
    providing a second electrode on the reacted metal body wherein the first electrode is Ni and the metal body is Cu.

6. The method of claim 5 wherein the first electrode is metal.

7. The method of claim 6 wherein the agent with which the portion of the first electrode reacts is an oxidizing agent.

8. The method of claim 6 wherein the agent with which the metal body reacts is an oxidizing agent.

9. The method of claim 5 and further comprising the device incorporated in a system.

10. The method of claim 9 wherein the system is selected from the group consisting of a hand-held device, a vehicle, and a computer.

* * * * *